United States Patent
Qu et al.

(10) Patent No.: US 9,128,142 B1
(45) Date of Patent: Sep. 8, 2015

(54) FERROMAGNETS AS PURE SPIN CURRENT GENERATORS AND DETECTORS

(71) Applicant: THE JOHNS HOPKINS UNIVERSITY, Baltimore, MD (US)

(72) Inventors: Danru Qu, Baltimore, MD (US); Bingfeng Miao, Nanjing (CN); Chia-Ling Chien, Cockeysville, MD (US); Ssu-Yen Huang, Taipei (TW)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 14/263,523

(22) Filed: Apr. 28, 2014

(51) Int. Cl.
*G01R 33/12* (2006.01)
*H01L 43/04* (2006.01)
*H01L 43/10* (2006.01)
*H01L 43/14* (2006.01)
*H01L 43/06* (2006.01)

(52) U.S. Cl.
CPC ............ *G01R 33/1284* (2013.01); *H01L 43/04* (2013.01); *H01L 43/06* (2013.01); *H01L 43/10* (2013.01); *H01L 43/14* (2013.01)

(58) Field of Classification Search
None
See application file for complete search history.

(56) References Cited

U.S. PATENT DOCUMENTS

| 8,604,571 | B2 | 12/2013 | Uchida et al. |
| 2009/0176129 | A1* | 7/2009 | Sarbanoo et al. ........... 428/811.3 |
| 2011/0001473 | A1* | 1/2011 | Moriyama et al. ............ 324/244 |
| 2013/0104948 | A1* | 5/2013 | Saitoh et al. .................. 136/200 |

FOREIGN PATENT DOCUMENTS

WO 2013/025994 A2 2/2013

OTHER PUBLICATIONS

Miao et al., "Inverse Spin Hall Effect in a Ferromagnetic Metal," Physical Review Letters, published by American Physical Society, Aug. 9, 2013, pp. 066602-1 through 066602-5.
Dorsey et al., "Epitaxial Yttrium-Iron-Garnet Films Grown by Pulsed-Laser Deposition," Journal of Applied Physics, 74, (1993) pp. 1242-1246.

* cited by examiner

*Primary Examiner* — Jerome Jackson, Jr.
*Assistant Examiner* — Steven B Gauthier
(74) *Attorney, Agent, or Firm* — MH2 Technology Law Group, LLP

(57) ABSTRACT

Provided is a spintronics device. The spintronics can include a ferromagnetic metal layer, a positive electrode disposed on a first surface portion of the ferromagnetic metal layer, and a negative electrode disposed on a second surface portion of the ferromagnetic metal.

21 Claims, 8 Drawing Sheets

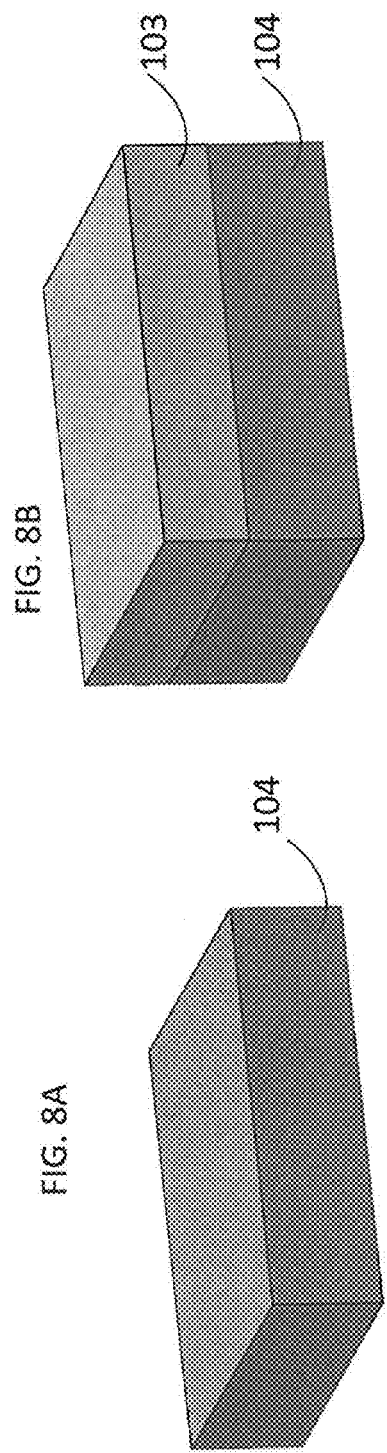
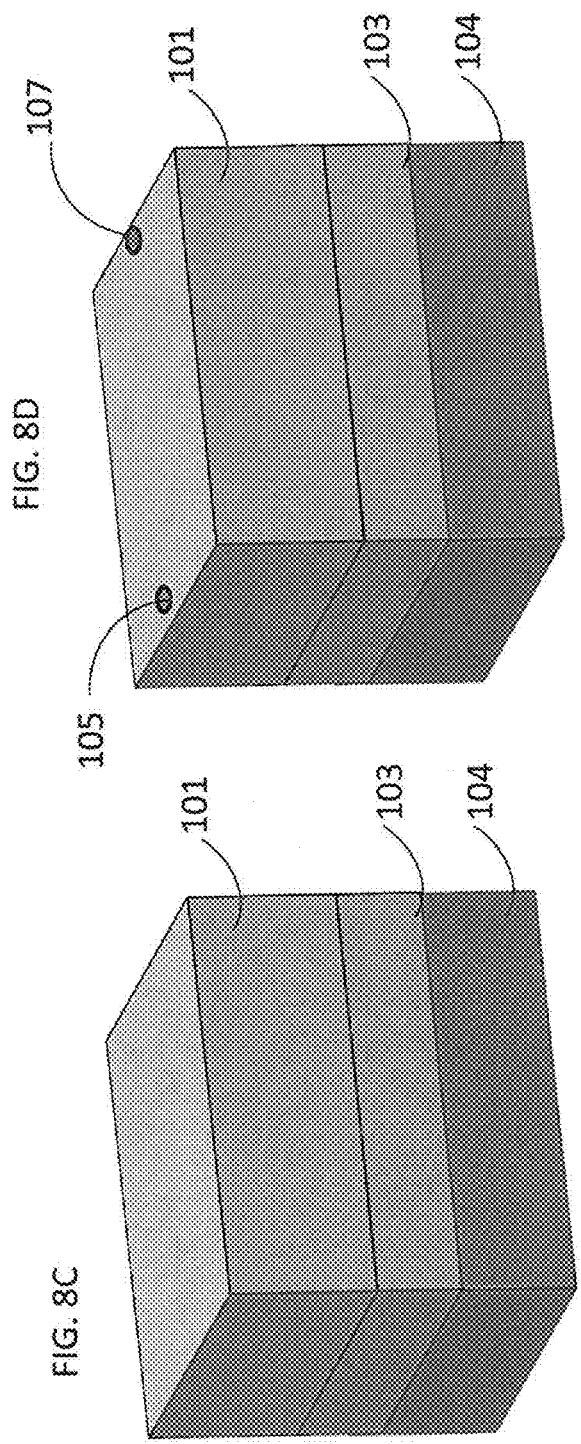

FERROMAGNETS AS PURE SPIN CURRENT GENERATORS AND DETECTORS

GOVERNMENT SUPPORT STATEMENT

This invention was made with government support under Grant No. DE-SC0009390 awarded by the Department of Energy. The government has certain rights in the invention.

FIELD OF THE INVENTION

This invention relates generally to the field of spintronic devices, particularly the generation, detection and exploitation of pure spin current via inverse spin-Hall effect, and specifically to the field of ferromagnetic metal-based pure spin generators and detectors.

BACKGROUND OF THE INVENTION

Spin polarized current has been widely used in spintronic devices. Recent trends indicate pure spin current would be even better for spintronics. For example, a great deal of attention has been focused on pure spin current because of its unique attribute of carrying substantial angular momentum with minimal charge carriers, thus generating much less Joule heat. However, a pure spin current cannot be generated by the usual electrical means except through a few mechanisms, among them spin Hall effect (SHE), lateral spin valve, spin pumping, and spin Seebeck effect (SSE), by exploiting heavy (high-Z) metals with strong spin-orbit coupling (SOC) for the generation or detection of the pure spin current.

The most widely used method for detecting a pure spin current is the inverse spin-Hall effect (ISHE) that converts spin current back into a charge current. To date, ISHE has been demonstrated only in a few non-magnetic metals with strong spin orbit coupling, such as Pt and Au. Such non-magnetic metals have, therefore, been used as pure spin current generators and detectors, but at a very high material cost.

For example, U.S. Pat. No. 8,604,571, the entire contents of which are incorporated by reference in herein in their entirety, discloses a thermoelectric conversion device that includes a nonmagnetic inverse spin-Hall effect material, for example, Pt, Au, Pd, Ag, Bi or an element having an f-orbital, with a spin-wave spin current generating material made of a magnetic dielectric material.

Additionally, in International Publication Number WO 2013/025994, the entire contents of which are incorporated by reference herein in their entirety, discloses a device with a spin-Hall base layer comprising a non-magnetic conductor, and a free layer that contacts the spin Hall effect layer wherein the spin Hall base layer comprises a non-magnetic conductor material What is needed in the art are spintronics devices, such as spin current generators and detectors, that offer higher spin and charge conversion efficiency and much lower cost.

SUMMARY

In an embodiment, there is a spintronics device. The spintronics can include a ferromagnetic metal layer, a positive electrode disposed on a first surface portion of the ferromagnetic metal layer, and a negative electrode disposed on a second surface portion of the ferromagnetic metal.

In another embodiment there is a spintronics system. The spintronics system can include a spintronics device and a magnetic field source for providing magnetic field to the spintronics device. The spintronics device can include a ferromagnetic metal layer, a positive electrode disposed on a first surface portion of the ferromagnetic metal layer, and a negative electrode disposed on a second surface portion of the ferromagnetic metal.

In yet another embodiment, there is a method of making a spintronics device. The method can include forming a magnetic dielectric layer, forming ferromagnetic metal layer on the magnetic dielectric layer, forming a positive electrode on a first surface portion of the ferromagnetic layer, and forming a negative electrode on second surface portion of the ferromagnetic metal layer.

Advantages of at least one embodiment include the use of ferromagnetic metals as superior pure spin current detectors for low energy consumption during writing and reading for storage devices.

Additional advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIGS. 8A-8D illustrates an embodiment for a method of making a spintronics device such as the spintronics device of FIG. 4.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

As described in B. F. Miao, et al., "Inverse Spin Hall Effect in a Ferromagnetic Metal," PRL 111, 066602 (2013), the entire contents of which are incorporated by reference herein in their entirety, the present inventors have demonstrated inverse spin-Hall effect (ISHE) in a ferromagnetic metal such as permalloy (Py) on a ferromagnetic insulator. Thus, by identifying the ISHE in a ferromagnet, embodiments are described herein as comprising ferromagnetic materials for spin current generators and detectors, which offer higher spin and charge conversion efficiency at much lower cost as compared to non-magnetic materials, can be realized.

Figure 1:
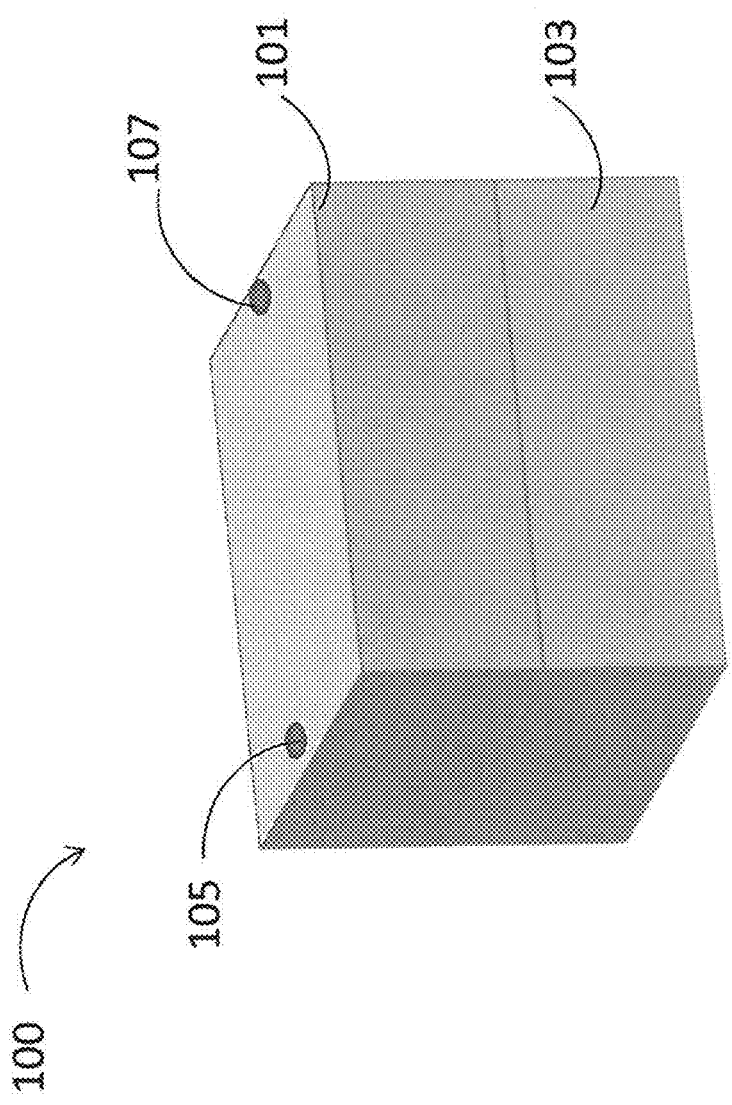
FIG. 1 is a perspective view of a spintronics device of an embodiment.

As shown in FIG. 1, an embodiment includes a spintronics device 100. The spintronics device can comprise a first layer, such as a ferromagnetic metal layer 101. That is, the first layer can be formed of a ferromagnetic metal. A positive electrode 105 can be disposed on a first surface portion of the ferromagnetic metal layer 101. A negative electrode 107 can be disposed on a second surface portion of the ferromagnetic metal. In an example, the positive and the negative electrodes can be made of indium or any low resistivity electrodes. The spintronics device 100 can further comprise a second layer, such as a magnetic dielectric layer 103, on which the ferromagnetic metal layer is disposed. The magnetic dielectric layer 103, if thick enough, can function as a substrate on which the ferromagnetic layer is deposited.

Figure 2:
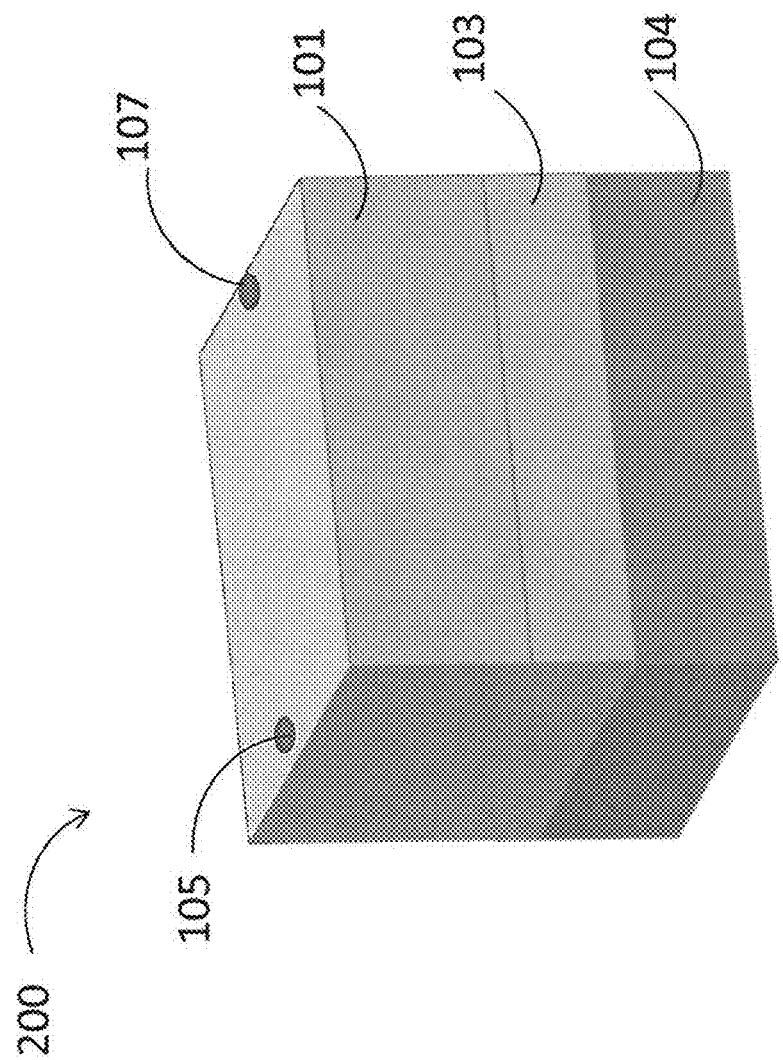
FIG. 2 is a perspective view of a spintronics device of an embodiment.

In another example, as shown in FIG. 2, an embodiment includes a spintronics device 200. The spintronics device 200 can comprise similar features as spintronics device 100, except that spintronics device 200 can further include a substrate 104. In an example, substrate 104 can be formed of a different material than magnetic dielectric 103.

The magnetic dielectric material of the magnetic dielectric layer 103 can comprise a ferrimagnetic dielectric, a ferromagnetic dielectric, or an antiferromagnetic dielectric. For example, the magnetic dielectric can comprise $Y_3Fe_5O_{12}$ (YIG). Magnetic dielectric material can be grown as epitaxial thin YIG film on $Gd_3Ga_5O_{12}$ [111] (GGG) substrate, where the substrate can be purchased commercially (available through MTI Corporation, Richmond, Calif. as product no. GGGc050505S1). Alternatively, the magnetic dielectric layer can be purchased commercially as bulk YIG (available from SurfaceNet GmbH, Rheine, German as product no. ES1294).

The ferromagnetic metal can comprise at least one of cobalt, iron, or nickel, an alloy of cobalt, iron, or nickel, or combinations thereof. For example, the ferromagnetic metal can comprise a transition metal and another material, such as compositions comprising FeGe. In an embodiment, the ferromagnetic metal comprises permalloy (Py) which can be represented by $Ni_xFe_{1-x}$ wherein x corresponds to a percentage of nickel content, for example, with about 20% iron content and about 80% nickel content.

The magnetic dielectric layer 103 can comprise a thickness in the range of about 10 nm to about 1 mm, for example about 20 nm to about 1 mm, or for example, about 0.5 mm. The ferromagnetic metal can comprise a thickness in the range of about 3 nm to about 30 nm, for example, about 3 nm to about 20 nm, such as about 3 nm to about 10 nm, or such as about 3 nm to about 5 nm.

As shown in FIGS. 3-6, spintronics devices 100 and 200 can each be included as part of a spintronics system. Thus, a spintronics systems 300, 400, 500 and 600 can each include a spintronics device, such as spintronics device 100 or spintronics device 200 described above.

The spintronics systems 300 and 500 can each comprise a voltage measuring device 108, such as a volt-meter for measuring voltage across the pair of electrodes 105 and 107 of each spintronics device 100 and 200, respectively. In each of the systems 300 and 500, therefore, the magnetic dielectric layer 103 can be configured to function as a spin current generator and the ferromagnetic metal layer 101 can be configured to function as a spin current detector, such as an inverse spin-Hall-effect spin current detector. For example, system 300 can further comprise a heat source 118, such as a resistive heater, that, when activated, is in such a proximity to the magnetic dielectric layer that is forms a temperature gradient across at least a portion of the magnetic dielectric layer 103 in a first direction 113. The heat source (resistive heater) 118 can be placed on top of the ferromagnetic layer 101, such as at a top surface of the ferromagnetic layer 101, and a cold sink 119, such as Cu block, can be placed at the bottom of the device as heat sink. For example, cold sink 119 can be attached to a bottom surface of the magnetic dielectric layer and bonded thereto with thermal paste. Upon activating the heat source, a temperature gradient ($\nabla T$) can be imposed across the spintronic device in first direction 113. By controlling the power applied to the resistive heater, the temperature difference between the surface of ferromagnetic metal permalloy to the bottom of magnetic dielectric YIG can be manipulated to fall within a range of a few degrees, for example 10° K. A magnetic field (H) can then be applied at a second direction 111 to control the magnetic moment direction of the magnetic dielectric layer 103. Due to the spin Seebeck effect, the spin current is generated in the magnetic dielectric layer and with the spin index in the same direction as the magnetic moment. The spin current can then be injected into the ferromagnetic metal layer 101, and can be converted to charge current due to the inverse spin Hall effect within ferromagnetic metal layer 101. The inverse spin Hall voltage is obtained at a third direction 117 and can be read by a nano-voltmeter at 108. The spintronics systems 300 and 500 can also be configured to function as a voltage generator by imposing a temperature gradient across the spintronics device.

Alternatively, spintronics systems 400 and 600 can each comprise a current source 110, such as an external power source, in electrical communication with the positive 105 and negative 107 electrodes of each spintronics device, 100 and 200, respectively. In each of the systems 400 and 600, the magnetic dielectric layer 103 can be configured to function as a spin current detector and the ferromagnetic metal layer 101 can be configured to function as a spin current generator, such as a spin-Hall-effect spin current generator or an anomalous-Hall-effect spin current generator. For example, current source 110 can be activated to inject charge current across ferromagnetic metal layer 101. Due to the anomalous Hall effect in the ferromagnetic layer, spin polarized current ($J_{SP}$)

can be generated in the transverse direction 115' and transported into the magnetic dielectric. A spin current absorption and reflection at the interface between the ferromagnetic metal layer 101 and magnetic dielectric layer 103 can be controlled by a magnetic field H provided by a magnetic field source (not shown) in a third direction 111. Due to the spin Peltier effect, a temperature gradient can be generated in the magnetic dielectric when a spin current is injected. This temperature gradient can be detected by a temperature sensing device 112, such as a thermocouple, between at least a portion of the magnetic dielectric layer 103.

Instead of the heat source 118, at least one of the systems 300 and 500 can include a microwave source (not shown) that provides microwaves to the spintronics device to excite the spin current in the magnetic dielectrics at the dielectric resonance frequency (e.g., in YIG, the resonance frequency is a few GHz in response to a magnetic field of a few kOe).

Figure 3:
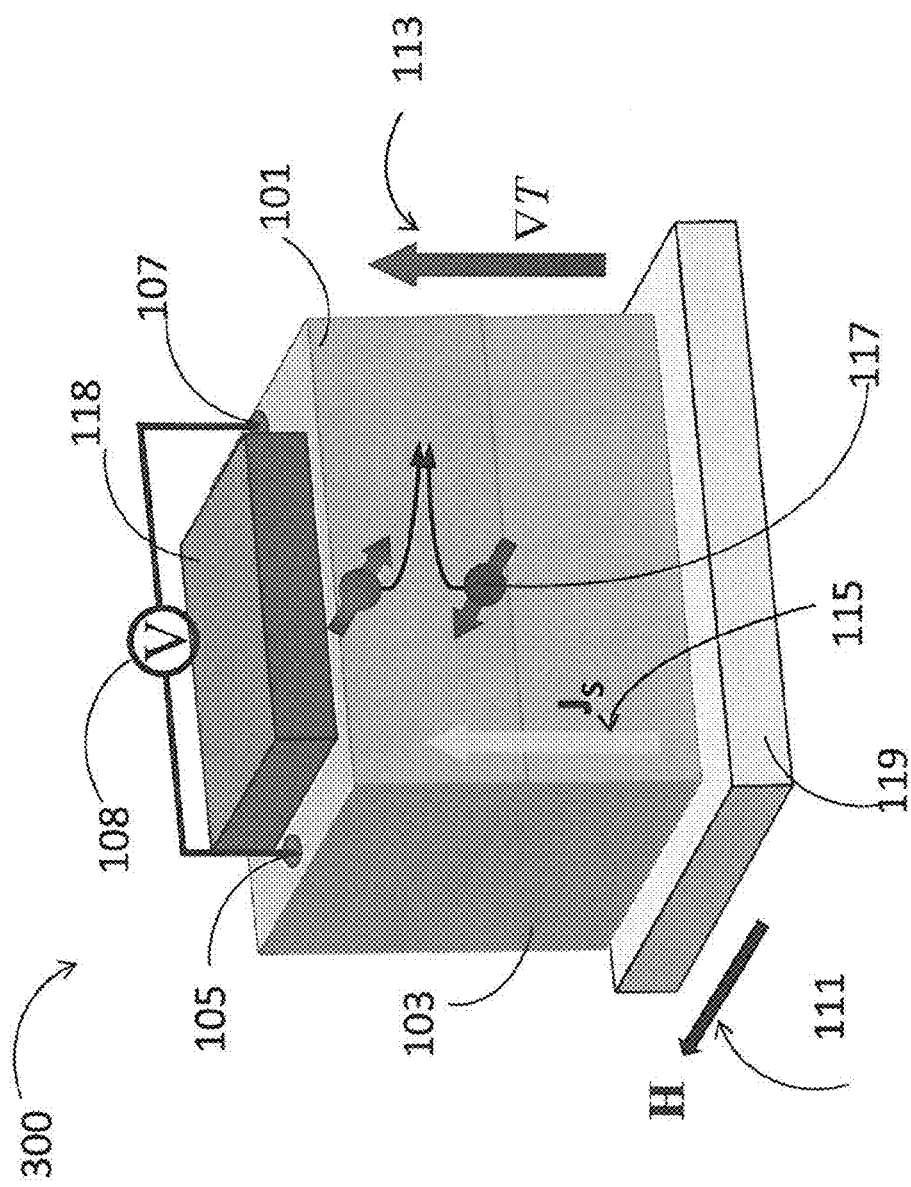
FIG. 3 is a perspective view of a spintronics system of an embodiment that includes the spintronics device of FIG. 1.
Figure 4:
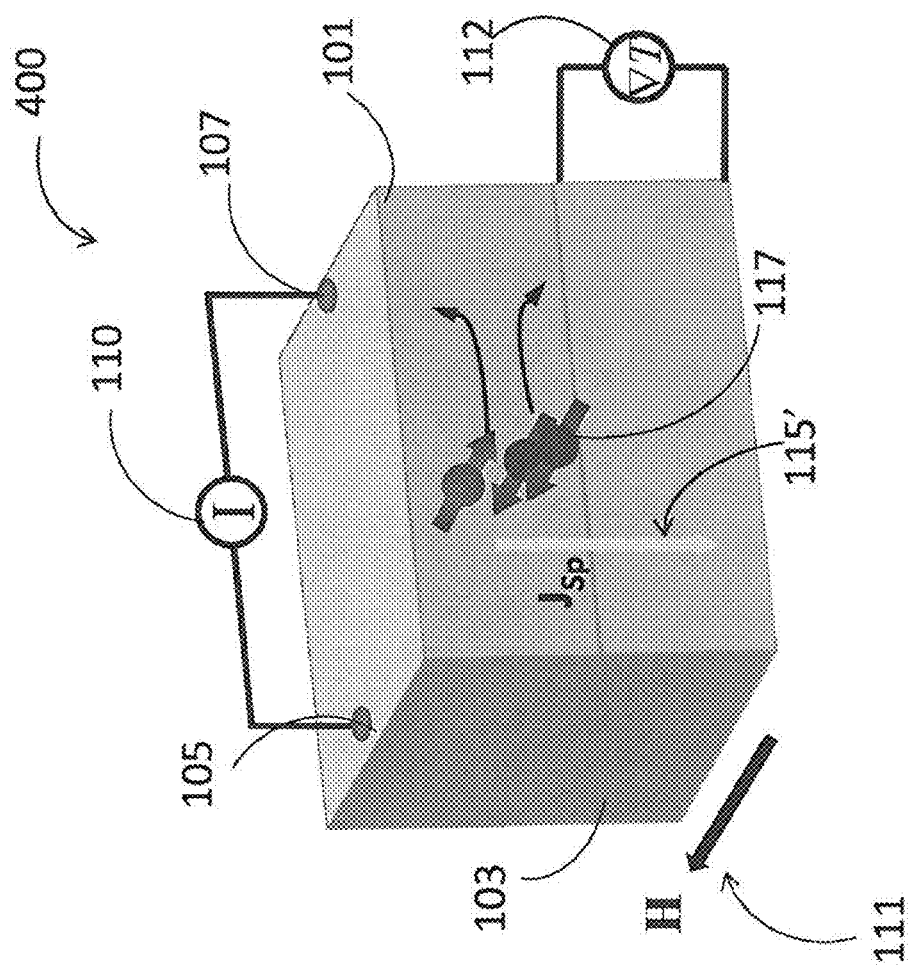
FIG. 4 is a perspective view of a spintronics system of an embodiment that includes the spintronics device of FIG. 1.
Figure 5:
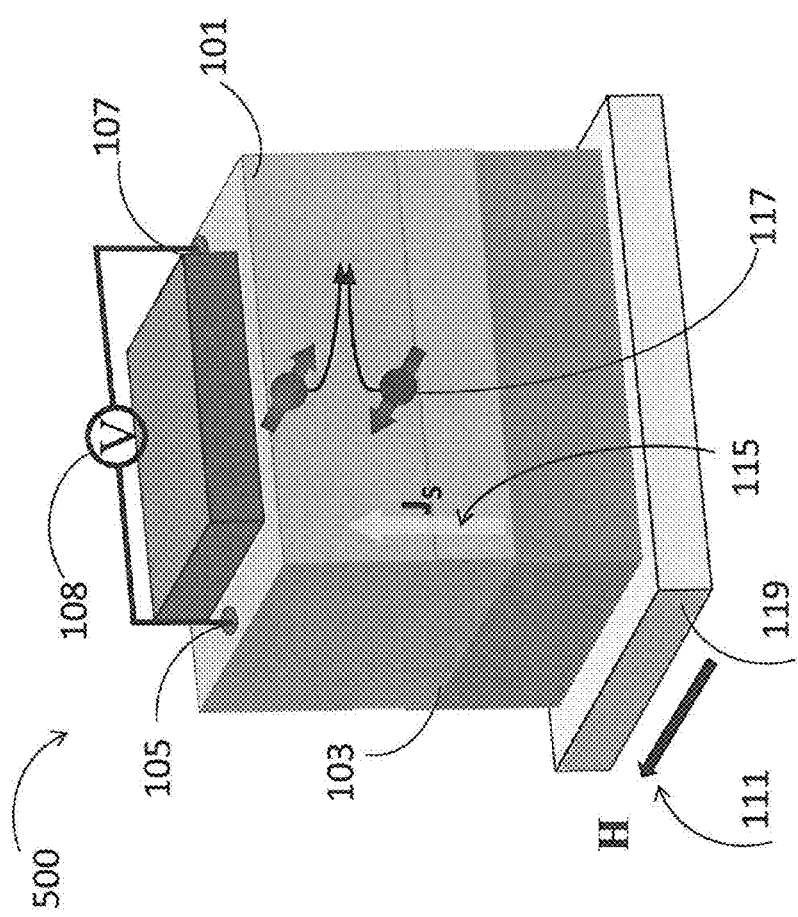
FIG. 5 is a perspective view of a spintronics system of an embodiment that includes the spintronics device of FIG. 2.
Figure 6:
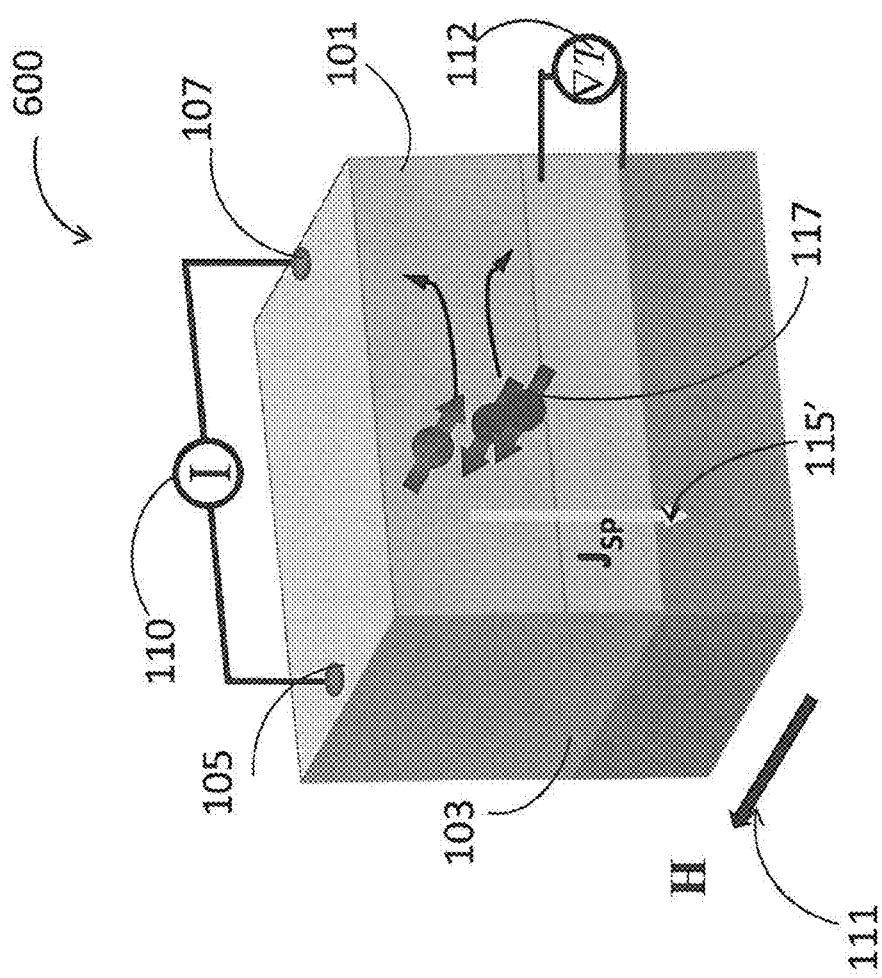
FIG. 6 is a perspective view of a spintronics system of an embodiment that includes the spintronics device of FIG. 2.
Figure 7A:
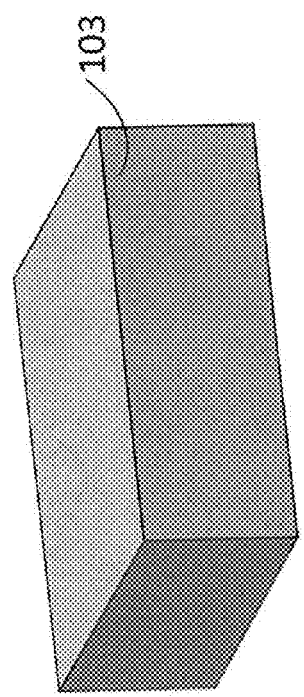
FIGS. 7A-7C illustrates an embodiment for a method of making a spintronics device such as the spintronics device of FIG. 1.
Figure 7B:
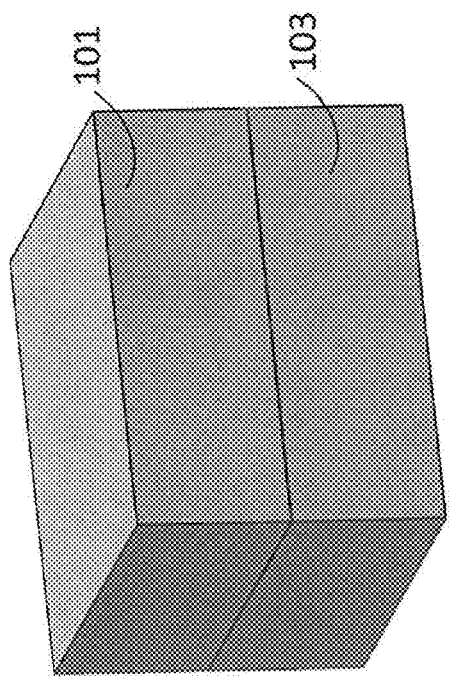
Figure 7C:
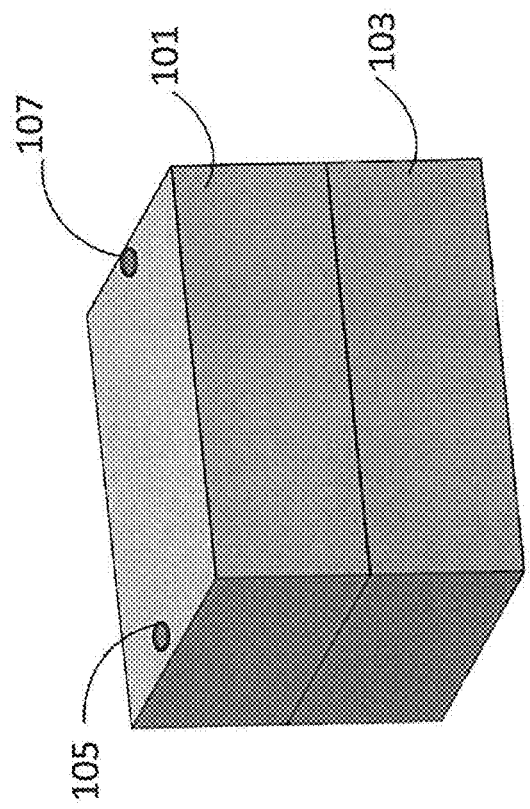

In an embodiment, there is a method of making a spintronics device as illustrated in FIGS. 7A-7C. For example, magnetic dielectric layer 103, such as a commercially available bulk magnetic dielectric layer as described above, can be provided as shown in FIG. 7A. Ferromagnetic metal layer 101 can then be deposited on the magnetic dielectric layer as shown in FIG. 7B. For example, a permalloy thin film can be deposited via magnetron sputtering (power of ~10 W, base pressure of $7 \times 10^{-8}$ Torr, Ar pressure of 3 mTorr). As shown in FIG. 7C, positive 105 and negative 107 electrodes can be formed on respective surface portions of the ferromagnetic metal. In an example, the positive 105 and negative 107 electrodes can be formed of indium. In operation, positive charge and negative charge accumulates at the two sides of the ferromagnetic metal layer, as shown in FIG. 3, due to the inverse spin Hall effect. The ductile indium dots (electrodes) provide an electrical connection between the FM metal to the voltage reading device. The electrodes can also be formed Al wire bonding or by depositing the metal electrode via patterning such as by photolithography technique.

In another embodiment, there is an alternate method of making a spintronics device as illustrated in FIGS. 8A-8D. For example, in a first step $Gd_3Ga_5O_{12}$ (GGG) substrate 104 (available through MTI Corporation, Richmond, Calif.; item no. GGGc050505S1) may be provided as shown in FIG. 8A. In FIG. 8B, the magnetic dielectric thin film layer 103 (having a thickness of a few nanometers) can be epitaxially grown on a GGG substrate via RF magnetron sputtering (power of ~50 W, base pressure of $7 \times 10^{-8}$ Torr, Ar pressure of 3 mTorr). After the deposition, the film is annealed in open air for 2 hours at 850 C as described in Dorsey, P. C., et al., Epitaxial yttrium-iron-garnet films grown by pulsed-laser deposition, J. Appl. Phys. 74, 1242 (1993), the entire contents of which as incorporated by reference in their entirety herein. Ferromagnetic metal layer 101 can then be deposited on the magnetic dielectric layer as shown in FIG. 8C. For example, a permalloy thin film can be deposited via magnetron sputtering (power of ~10 W, base pressure of $7 \times 10^{-8}$ Torr, Ar pressure of 3 mTorr). As shown in FIG. 8D, positive 105 and negative 107 electrodes can be formed on respective surface portions of the ferromagnetic metal. In an example, the positive 105 and negative 107 electrodes can be formed of indium.

While the invention has been illustrated respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function.

For example, the embodiments described herein are capable of serving as the thermal electrical conversion device based on ferromagnetic materials. Devices 300 and 500 can each be used, for example, to generate voltage in the ferromagnetic metals in response to a heat current in the magnetic dielectric layer. Meanwhile, devices 400 and 600 can each be used to cool or heat the magnetic dielectric layer from the spin current generated in the ferromagnetic metal layer.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A spintronics device, comprising:
   a ferromagnetic metal layer;
   a magnetic dielectric layer, wherein the ferromagnetic metal layer is disposed on the magnetic dielectric layer;
   a substrate, wherein the magnetic dielectric layer is disposed between the substrate and the ferromagnetic metal layer;
   a positive electrode disposed on a first surface portion of the ferromagnetic metal layer; and
   a negative electrode disposed on a second surface portion of the ferromagnetic metal layer.

2. The spintronics device of claim 1, wherein the magnetic dielectric layer comprises a ferrimagnetic dielectric, a ferromagnetic dielectric, or an antiferromagnetic dielectric.

3. The spintronics device of claim 1, wherein the magnetic dielectric layer comprises $Y_3Fe_5O_{12}$ (YIG).

4. The spintronics device of claim 1, wherein the ferromagnetic metal layer comprises at least one of cobalt, iron, nickel, or alloys thereof.

5. The spintronics device of claim 4, wherein the ferromagnetic metal layer comprises permalloy.

6. The spintronics device of claim 1, wherein the magnetic dielectric layer comprises a thickness in the range of about 10 nm to about 1 mm, and the ferromagnetic metal layer comprises a thickness in the range of about 3 nm to about 30 nm.

7. A spintronics system, comprising:
   a spintronics device comprising
      a ferromagnetic metal layer,
      a magnetic dielectric layer, wherein the ferromagnetic metal layer is disposed on the magnetic dielectric layer,
      a substrate, wherein the magnetic dielectric layer is disposed between the substrate and the ferromagnetic metal layer,
      a positive electrode disposed on a first surface portion of the ferromagnetic metal layer, and
      a negative electrode disposed on a second surface portion of the ferromagnetic metal layer; and
   a magnetic field source for providing magnetic field to the spintronics device and located to control the magnetic moment of the magnetic dielectric layer.

8. The spintronics system of claim 7, further comprising a voltage measuring device in electrical communication with the positive and negative electrodes, wherein the magnetic dielectric layer comprises a spin current generator and the ferromagnetic metal layer comprises a spin current detector.

9. The spintronics system of claim 7, further comprising a current source in electrical communication with the positive and negative electrodes, wherein the magnetic dielectric layer comprises a spin current detector and the ferromagnetic metal layer comprises a spin current generator.

10. The spintronics system of claim 7, wherein the magnetic dielectric layer comprises a ferrimagnetic dielectric, a ferromagnetic dielectric, or an antiferromagnetic dielectric.

11. The spintronics system of claim 7, wherein the magnetic dielectric layer comprises $Y_3Fe_5O_{12}$ (YIG).

12. The spintronics system of claim 7, wherein the ferromagnetic metal layer comprises at least one of cobalt, iron, nickel, or alloys thereof.

13. The spintronics system of claim 12, wherein the ferromagnetic metal layer comprises permalloy.

14. The spintronics system of claim 7, further comprising a heat source on the ferromagnetic metal layer that forms a temperature gradient across at least a portion of the magnetic dielectric layer.

15. The spintronics system of claim 7, further comprising a thermocouple connected to the magnetic dielectric layer and configured to measure a temperature difference at least across the magnetic dielectric layer.

16. The spintronics system of claim 7, further comprising a microwave source that provides microwaves to the spintronics device at a resonance frequency of the magnetic dielectric layer and located such that the magnetic dielectric layer generates spin carriers.

17. A method of making a spintronics device, comprising:
    forming a magnetic dielectric layer;
    forming a ferromagnetic metal layer on the magnetic dielectric layer;
    forming a positive electrode on a first surface portion of the ferromagnetic metal layer; and
    forming a negative electrode on a second surface portion of the ferromagnetic metal layer.

18. The spintronics system of claim 7 further comprising a cold sink on a bottom surface of the spintronics device.

19. The spintronics system of claim 7, wherein the magnetic moment of the magnetic dielectric determines spin orientation in a pure spin current when the magnetic dielectric is used as a spin current generator.

20. The spintronics system of claim 7, wherein the magnetic moment of the magnetic dielectric controls a spin current absorption and reflection when the magnetic dielectric is used as a spin current detector.

21. The spintronics system of claim 20, wherein the spin current absorption and reflection are controlled at an interface between the ferromagnetic layer and the magnetic dielectric layer.

* * * * *